(12) United States Patent
Mattos et al.

(10) Patent No.: US 8,728,849 B1
(45) Date of Patent: May 20, 2014

(54) LASER CUTTING THROUGH TWO DISSIMILAR MATERIALS SEPARATED BY A METAL FOIL

(75) Inventors: Laila Mattos, Palo Alto, CA (US); Daniel G. Patterson, Morgan Hill, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 453 days.

(21) Appl. No.: 13/222,686

(22) Filed: Aug. 31, 2011

(51) Int. Cl.
*H01L 21/78* (2006.01)
*H01L 21/302* (2006.01)

(52) U.S. Cl.
USPC ............ 438/68; 438/463; 216/65; 216/94; 219/121.69; 219/121.72; 219/121.84

(58) Field of Classification Search
USPC ........... 438/57, 64, 68, 460, 463; 216/65, 94; 219/121.68, 121.69, 121.72, 121.84
See application file for complete search history.

(56) References Cited

U.S. PATENT DOCUMENTS

| | | | |
|---|---|---|---|
| 5,874,011 A * | 2/1999 | Ehrlich | 216/65 |
| 6,555,016 B2 * | 4/2003 | Lai | 216/18 |
| 6,849,524 B2 | 2/2005 | Shelton et al. | |
| 7,288,466 B2 * | 10/2007 | Takeishi et al. | 438/463 |
| 7,772,090 B2 | 8/2010 | Starkston et al. | |
| 7,804,043 B2 | 9/2010 | Deshi | |
| 2002/0086137 A1 | 7/2002 | Brouillette et al. | |
| 2007/0272666 A1 | 11/2007 | O'Brien et al. | |
| 2007/0272668 A1 | 11/2007 | Albelo et al. | |
| 2008/0070378 A1 | 3/2008 | Yeo | |
| 2008/0220590 A1 | 9/2008 | Miller et al. | |
| 2010/0099238 A1 | 4/2010 | Vakanas et al. | |
| 2010/0219509 A1 | 9/2010 | He et al. | |
| 2010/0279490 A1 | 11/2010 | Starkston et al. | |

* cited by examiner

*Primary Examiner* — Samuel M Heinrich
(74) *Attorney, Agent, or Firm* — Thomas Schneck; Gina McCarthy

(57) ABSTRACT

A method of laser cutting through dissimilar materials separated by a metal foil. A material stack includes a semiconductor layer or film, with a metal foil layer attached to the back surface. The metal foil layer is attached to an insulative support material layer. A laser parameter is selected and optimized for the material stack. A laser beam creates a kerf in the material stack down to the metal foil layer. The laser beam removes metal through the kerf primarily by gasification rather than melting. Kerf formation continues after optimization of the laser parameter for removal of material from the remaining layers. A debris field resulting from the laser cutting of the metal layer is reduced and/or a portion of the debris is removed in an assisted manner as the beam cuts. The materials are diced by cutting the kerf through all materials.

20 Claims, 5 Drawing Sheets

LASER CUTTING THROUGH TWO DISSIMILAR MATERIALS SEPARATED BY A METAL FOIL

TECHNICAL FIELD

The field of the present invention relates to semiconductor substrate dicing by laser radiation.

BACKGROUND

Traditional methods or systems for scribing, cutting and separating semiconductor devices from a semiconductor wafer, i.e. dicing, rely on cutting a street defined by a scribe line, using a diamond saw or a laser. In throughcutting, a single pass is made using the diamond saw or laser, cutting all the way through the wafer. In another technique, known as wafer fracturing, die separation is performed by cutting along a street partially through the thickness of the wafer, then cracking the wafer along the street and separating the dice. A scribe line can be expressed or delineated physically on the wafer, using scribe line geometries that are photolithographically deposited using one or more layers on the wafer, such as by using photoresist and etching. A scribe line can be physically delineated on the wafer by laser ablation of the wafer surface. Alternatively, a scribe line can be defined on the wafer in the abstract, for example using data in a computer memory, as a path along which a street is to be cut where only a reference feature on the wafer is needed. Whether or not a scribe line is physically delineated on a wafer, the scribe line can be expressed as a set of coordinates relative to a reference feature on the wafer.

Mechanical cutting of semiconductor wafers can cause cracks, splitting, damage to PN junctions and other effects on the wafers and devices being fabricated on the wafers. The width of the street and the corresponding amount of material removed represents wasted area of the wafer. It is desired to minimize the width of the street and minimize the wasted area of the wafer, thereby minimizing the cost per die produced.

Laser cutting generally produces a narrower street than diamond saw cutting. However, local heating from laser cutting can damage PN junctions. Combining a semiconductor wafer with one or more additional materials poses additional challenges to laser cutting or mechanical cutting.

Standard silicon wafers are nominally 275 microns to 775 microns thick, although additional sizes have been and are being developed. Thin wafers are nominally 100 microns to 150 microns thick. Ultrathin wafers can support thin films of nanometer or monolayer thicknesses and be up to several microns thick. Thin wafers or ultrathin wafers may need additional support during fabrication and handling, which poses challenges to laser cutting or mechanical cutting.

Solar cells, also known as, photovoltaic cells, can be made from silicon wafers or from thin films, such as gallium arsenide films, among other materials. Epitaxial lift-off (ELO) films can be grown on wafers, then transferred to support surfaces. U.S. published application 2010/0219509 entitled "Tiled Substrates for Deposition and Epitaxial Lift Off Processes" by G. He and A. Hegedus, assigned to the assignee of the present invention and incorporated by reference herein, shows epitaxially grown film stacks transferred to a support substrate in a tiling pattern with gaps or streets between each of the ELO film stacks. An extensive list of support substrate materials is contained in the aforementioned published application.

Typically, solar cells are cut from semiconductor wafers and mounted in a solar panel. Solar cells generally have one PN junction fabricated vertically in the wafer, often with the N type material towards the front major surface of the wafer and the P type material towards the back major surface of the wafer. Metal traces on the front surface of the wafer are connected as one or more buss bars to one terminal of the solar cell, and metal backing the entirety of the back surface of the wafer is connected to another terminal of the solar cell. The presence of the large PN junction throughout the solar cell poses challenges to laser cutting or mechanical cutting, as shorting of the PN junction at any location on a scribe line can ruin the entire solar cell.

Slag or ablation debris is produced during laser cutting, and deposited along edges of the cut and nearby surfaces. This debris can short-circuit electrical junctions of solar cells or integrated circuits, or provide resistive paths degrading device performance. On solar cells, the debris can block photons, decreasing solar cell efficiency. Since the debris is made of the same material as the wafer albeit lacking the crystalline structure of the wafer, the debris can bond to wafer surfaces and be difficult to remove.

SUMMARY

A method of laser cutting through dissimilar materials separated by a metal foil is described. A first material includes at least one semiconductor layer and has a front surface and a back surface. A metal foil layer is attached to the back surface of the first material, forming a material stack.

The metal foil layer is also attached to a second material that is an insulative support. The second material is dissimilar to the first material. The first material and the metal foil layer form a stack of materials that is useful for fabrication of electronic devices, such as solar cells.

A laser parameter is optimized for a pulsed laser beam making cuts through the semiconductor layer. The laser parameter is such that the pulsed laser beam creates a kerf in the first material to a depth of the metal foil layer and then removes metal from the metal foil layer through the kerf. The pulsed laser beam removes the metal from the metal foil layer primarily by conversion of the metal to a gaseous phase, such as an ionized plasma, rather than by melting. The production of metal slag is reduced and the deleterious deposition of metal slag upon the semiconductor layer that could cause electrical failure is reduced.

A cutting path is established along the front surface of the first material such that the pulsed laser beam cuts through the stack of materials. At least a portion of the debris produced by the pulsed ultraviolet laser beam cutting through the stack of materials is removed. The removing of the debris is assisted and taking place as the beam cuts.

The laser parameter is then adjusted and optimized for cutting the second material through the kerf. The material stack and support layer are diced by using the pulsed laser beam to cut through the kerf to separate multiple devices.

In an embodiment, a semiconductor film having semiconductor devices has a front surface and a back surface. A metal layer is attached to the back surface of the film. The film is laminated to a polymer substrate. An adhesive layer bonds the substrate to the metal layer backing the film.

A kerf is formed by selecting a laser parameter and removing respective material from the semiconductor film and the metal layer. By changing the laser parameter for the adhesive layer and the polymer substrate, cutting of these materials is optimized. Respective material is removed from the metal layer primarily by conversion to a gas phase so that deposition of metal slag upon the semiconductor film is reduced. The debris field resulting from laser cutting is managed by reducing the debris field during laser cutting of the metal layer using one or more selected methods. The film, the metal layer, the adhesive layer and the polymer substrate are diced, by deepening the kerf.

BRIEF DESCRIPTION THE DRAWINGS

DETAILED DESCRIPTION

Figure 1:
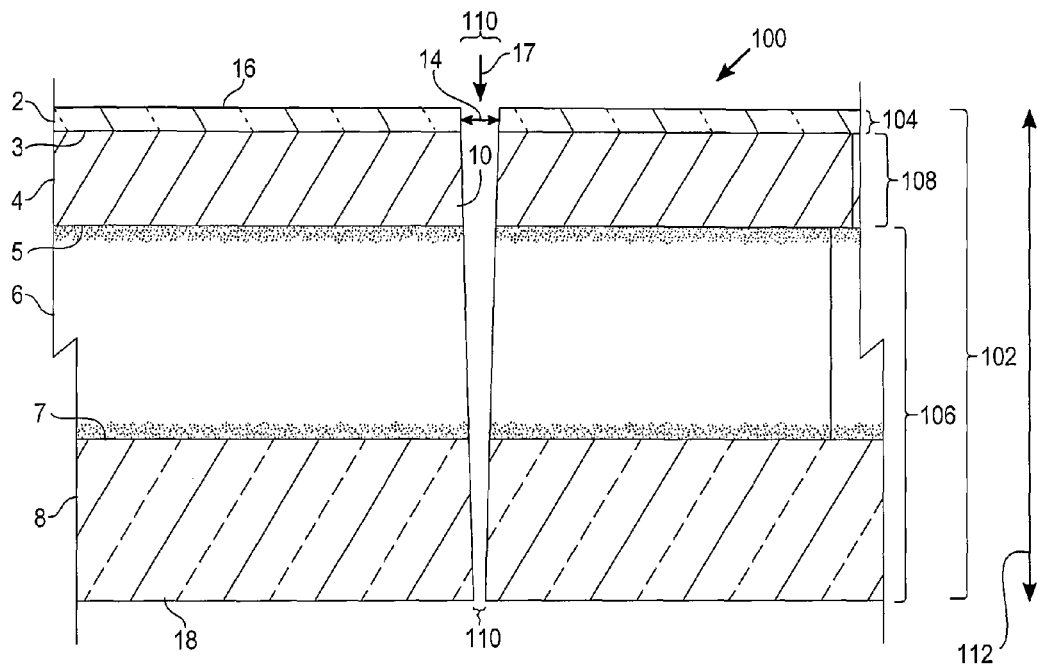
FIG. 1 is a cross-sectional view of a laser cut through a first material and a second material separated by a metal foil, in accordance with the present invention.

With reference to FIG. 1, an ultrathin gallium arsenide film 2 of about two microns thickness is cut by laser, so that semiconductor devices on the semiconductor film 2 are diced and separated. Film 2 could consist of several semiconductor film layers. The semiconductor devices could be electronic chips, opto-electronic devices or solar chips. In this example, the semiconductor devices are solar cells. The laser cut 100 is performed using a pulsed laser making a frontside cut 10 to form a kerf 110 having a kerf width 14. The kerf 110 separates the semiconductor devices.

The film 2 is backed by a metal layer 4 forming a material stack. All references to semiconductor films apply to ELO semiconductor films fabricated as solar cells. In this example, the metal layer 4 contacts the P type semiconductor material, and forms the positive terminal of the solar cell. Metal traces (not shown but readily understood) on the front surface 16 of the film 2 contact the N type semiconductor material and form the negative terminal of the solar cell.

In FIG. 1, the back surface 5 of the metal layer 4 is bonded to the front surface 7 of a translucent polymer support substrate 8 by an adhesive layer 6. In this example, the translucent polymer substrate 8 is a sheet of PET (polyethylene terephthalate), a polymer material that is moderately flexible and quite dissimilar from the material of the semiconductor film. PET material is not thermally conductive, while the semiconductor film is moderately thermally conductive. PET is a thermoplastic polymer resin of the polyester family, and is in known use as a flexible substrate for thin films, thin and ultrathin wafers. Translucent is herein defined to include translucent or transparent materials. The flexible translucent polymer substrate 8 provides support for the ultrathin gallium arsenide film 2 with metal layer 4 backing. In one example, after the solar cells are separated from the film 2, each solar cell retains a respective portion of the flexible polymer substrate 8 with corresponding portions of the adhesive layer 6 and the metal layer 4, and is mounted in a solar panel.

Example thicknesses for the layers are two microns for the gallium arsenide film 2, twenty microns of copper for the metal layer 4, fifty microns for the adhesive layer 6 and fifty microns of PET for the flexible polymer substrate 8. The film 2, which may include further layers such as front surface metal interconnect and/or photoresist, is a first material layer 104 that includes at least one semiconductor layer and has a front surface 16 and a back surface 3. The metal layer 4 is in this example a metal foil layer 108 attached to the back surface 3 of the first material layer 104. The flexible translucent polymer substrate 8 and the adhesive layer 6 are a second material layer 106 that is dissimilar to the first material layer 104. In this example, the first and second material layers 104, 106 are separated by the metal foil layer 108. In succession from front to back, the first material layer 104 and the metal foil layer 108 form a stack of materials supported by the second material layer 106, as a materials assembly 102.

A laser beam, optimized by selection of a parameter for the stack, is aimed in a direction 17 towards the front surface 16 of the film 2. The laser beam makes a frontside cut 10 from the front surface 16 of the film 2, through the stack. The laser is again optimized by selection of a laser parameter for cutting through the adhesive layer 6, through the flexible polymer substrate 8 and through the back surface 18 of the flexible polymer substrate 8. The laser is selected and tuned for the ability to cut through the respective layers and materials. Ultraviolet (UV) is a preferred wavelength for laser beam cutting of metals, but tends to take longer to cut through translucent and transparent materials than does an infrared laser beam. Infrared (IR) is a suitable wavelength for laser cutting of polymers, of which PET is a member, and adhesives, but tends to reflect off of metal. In this example, an ultraviolet laser beam is selected. A wavelength tunable laser could be used, or different lasers could be used to provide appropriate beams using beam switching optics.

Figure 2:
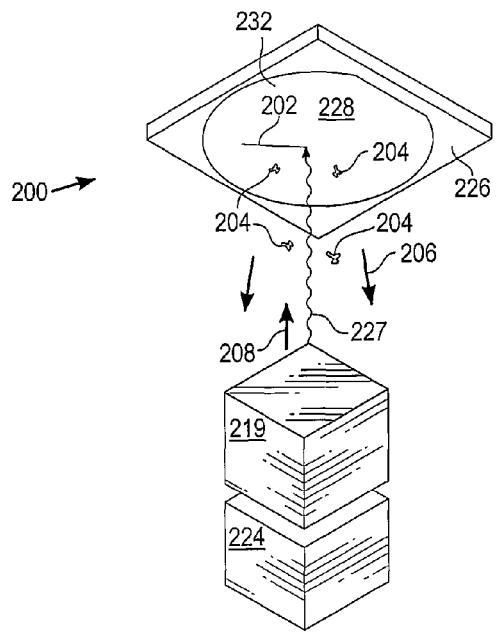
FIG. 2 is a perspective underside view of an inverted or upside down mounting, in which gravity assists removal of debris in the laser cut of FIG. 1.

An ultraviolet laser provides a corresponding ultraviolet laser beam (not shown in FIG. 1, see FIG. 2). The ultraviolet laser beam cuts through the film 2, through the metal layer 4, through the adhesive layer 6 and through the flexible polymer substrate 8. A suitable wavelength for the ultraviolet laser is 355 nanometers, which has been successfully tested using the disclosed method for cutting through the stack of materials and the materials assembly 102 with pulse widths in the nanosecond range, the picosecond range and the femtosecond range. Cuts along a scribe line or other path can be accomplished using a single-pass or a multi-pass process.

The ultraviolet laser beam is adjusted to control the depth and width of the cut, by testing and calibration. As shown in FIG. 1, the beam can be adjusted so that the ultraviolet laser beam produces a narrow frontside cut 10 and kerf width 14. Laser beam spot size, wavelength, intensity and pulse duration can be selected and tuned to produce the indicated cut in the respective materials. In this manner, the amount of material removed from the semiconductor film 2 is minimized.

As compared to a mechanical cutting process which can impart mechanical stresses and cause distortion or displacement to the solar film, the use of the laser beam provides improved positioning accuracy and eliminates cracks associated with mechanical sawing and separation. Laser power for the laser is about 5 watts average power. With the boundary of a solar cell defined by laser cuts, the active area of the solar cell is maximized as compared to mechanical cutting and attendant loss of active area.

Laser cutting, as shown in FIG. 1, generates debris including particles, gases and slag. This debris can damage the various materials being cut. Debris field management, in the form of reducing or removing debris, decreases the amount of damage done to the various materials. The laser cut 100 employs one or more debris management techniques.

With reference to FIG. 2, an upside down or inverted mounting 200 is shown, making use of gravity to assist removal of debris 204 produced by the laser cutting. The ultraviolet laser beam 227, produced by the ultraviolet laser 224 and steered by the beam steering device 229, is aimed in an upward direction 208 towards the front surface 238 of the film 232, making a laser cut 202 through the film 232 and through the remaining materials in the materials assembly 102 (as shown in FIG. 1). Laser cutting debris 204, in the form of gas phase debris that can include particles, is falling in a downward direction 206, away from the film 232 and other materials in the materials assembly 102. In this form of debris field management, with the removal of the debris being assisted by the inverted mounting and the use of gravity, the debris being removed does not settle on the film 232 or other materials in the materials assembly 102. Thus, a laser cut as shown reduces the damage to the materials and reduces the likelihood of short-circuiting the solar cells (in this example) or other semiconductor devices (in further examples) being fabricated.

Figure 3:
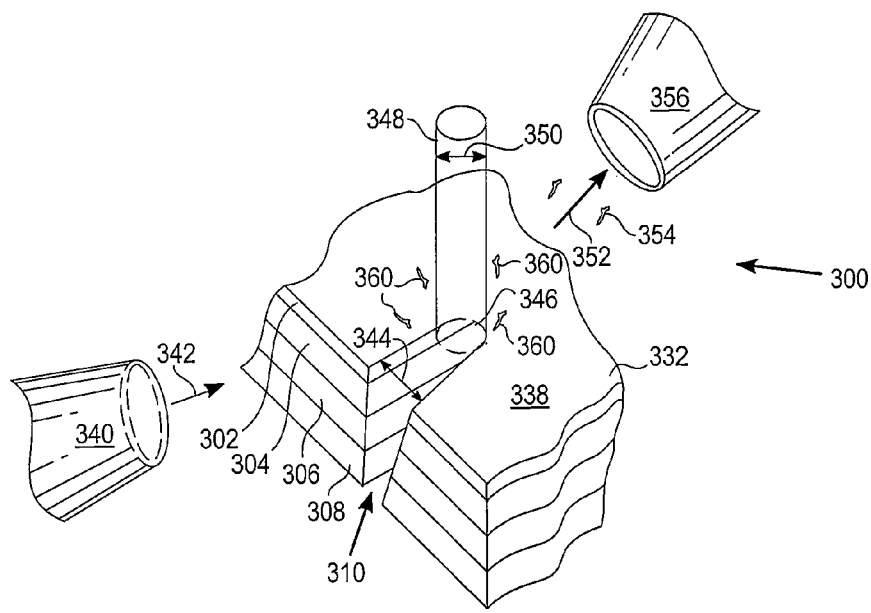
FIG. 3 is a perspective close-up view of a gas flow and vacuum apparatus assisting removal of debris in the laser cut of FIG. 1.

With reference to FIG. 3, a gas flow and a vacuum apparatus 300 assists in the removal of debris produced by laser cutting. The term vacuum is herein defined to include low pressure achieved by industrial vacuum pumps. A laser beam 348, having a beam width 350 and a laser spot 346, cuts through the materials assembly including the film layer 302, the metal layer 304, the adhesive layer 306 and the flexible substrate 308. The laser cutting forms a kerf 310 having a kerf width 344 relating to the size of the laser spot 346. Laser cutting proceeds from the front surface 338 of the film 332, and produces debris 354, 360. A gas flow 342, sourced by a gas nozzle 340 is directed to blow the debris 360 out of the kerf 310, flushing out and carrying the debris away from the front surface 338 of the film 332. A vacuum applied by the vacuum nozzle 356 extracts or pulls the debris 354 in a direction 352 towards and into the vacuum nozzle 356. Both the gas flow 342 and the applied vacuum assist in the removal of the debris 360, 354.

In further embodiments, debris is removed by a gas flow apparatus or a vacuum apparatus. In a still further embodiment, the laser spot 346 is reduced, either by focusing the laser beam 348 or by reducing the beam width 350, so that the kerf width 344 is reduced and the corresponding amount of debris produced in the laser cutting is reduced.

Figure 4:
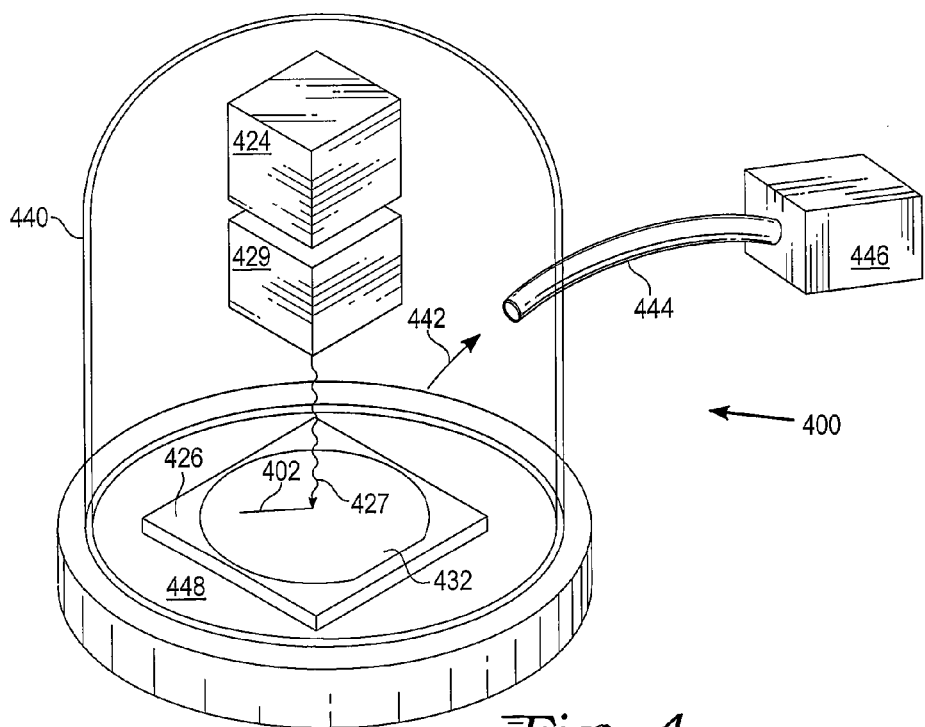
FIG. 4 is a perspective view of a vacuum chamber, with an applied vacuum assisting removal of debris in the laser cut of FIG. 1.

With reference to FIG. 4, a vacuum chamber 400 is shown enclosing the laser cut 402, so that debris is pulled or extracted in a direction 442 into a vacuum fitting 444 exiting the chamber. The example shown is illustrative, and further vacuum chambers can readily be devised. A glass housing 440 seals to a base 448, enclosing the film 432 and materials assembly. The glass housing 440 further encloses the laser 424 and beam steering device 429, along with a stage 426 supporting the film 432 and materials assembly. A vacuum pump 446 provides a vacuum or low pressure that is applied to the vacuum fitting 444 and the vacuum chamber 400.

Further embodiments of the debris-managing apparatuses shown in FIGS. 2, 3 and 4 can be applied to the laser cutting shown in FIG. 1. An inverted mounting can make use of a gas flow and/or an applied vacuum. A vacuum can be applied via a vacuum chamber or a vacuum nozzle. Any of the debris-managing apparatuses can be applied with various combinations of laser tuning. In one embodiment, the amount of debris produced by the laser cutting is reduced by an appropriate selection of a laser parameter, and the debris that is produced is removed by a debris removal technique. In a further embodiment, a multi-pass cut is selected and a portion of the debris is removed during or after each pass.

A differing gaseous environment can be applied during the laser cutting, for example by introducing one or more gases into a chamber such as the vacuum chamber 400, which is then used as a gaseous environment chamber. One or more gases with a lower molecular weight than nitrogen can increase the rate at which material is ablated during the laser cutting. For example, helium or argon can be used as a gaseous environment having a low molecular weight. The lower molecular weight in the gaseous environment increases the speed of sound, which increases the speed of propagation of a shockwave formed by the arrival of the laser pulse and the ablation that ensues. The rate of removal of material by ablation is constrained by the speed of sound and the speed of propagation of the shockwave. Each laser pulse creates such a shockwave. Thus, the use of many shorter duration laser pulses increases the rate of removal of material, and the use of a low molecular weight atmosphere increases the rate of removal of material. Both techniques reduce the amount of debris produced in the laser cut, as a greater percentage of the material is converted to a gaseous state.

One reason for selecting a nanosecond, picosecond or femtosecond range pulse width for the pulsed laser is that a shorter pulse width produces less debris from cutting the material. If each laser pulse is of a long duration, the material heats up. Vibrational modes of the atomic lattice of the material are excited, and heat energy is transferred. Heated up material can melt and produce slag. Short laser pulses break the material bonds directly, resulting in a more efficient removal of material and less heating.

Appropriate selections of laser parameters to reduce the amount of debris produced by the laser cutting include a reduced laser spot size, a reduced laser beam width, an average laser power that is sufficient to cut the materials but not excessive, a pulsed ultraviolet laser beam, a pulse width in a range of nanoseconds or narrower (e.g. picosecond range), a femtosecond range pulse width, a pulse repetition rate that reduces heating of the materials, etc. The pulse width of the laser beam can be matched to a bond strength of the material in the metal layer, for example by selecting a pulse width in the femtosecond range for an ultraviolet laser beam. A single pass cut can be selected, and a scan velocity selected such that the pulsed ultraviolet laser beam only just cuts through the back surface of the second material in the single-pass cut. A multi-pass cut can be selected, and a scan velocity selected such that the pulsed laser beam only just cuts through the back surface of the second material in the final pass of the multi-pass cut. The laser parameters can be selected so that the respective material is removed from the metal layer primarily by ionization or conversion to an ionized plasma rather than by melting and evaporation or sublimation, thereby reducing deposition of metal slag upon the semiconductor film and elsewhere. One or more laser parameters can be selected so that the respective material is removed from the metal layer primarily by conversion to a gaseous phase.

Reducing the amount of debris and/or assisting the removal of debris can further affect the quality of the plating metal or other surface materials. If a larger amount of debris is produced, a longer etch is required to clean the surface of the materials. Such a longer etch can remove some of the plating metal or other surface materials, degrading the quality of the solar cell or other product being manufactured.

Figure 5A:
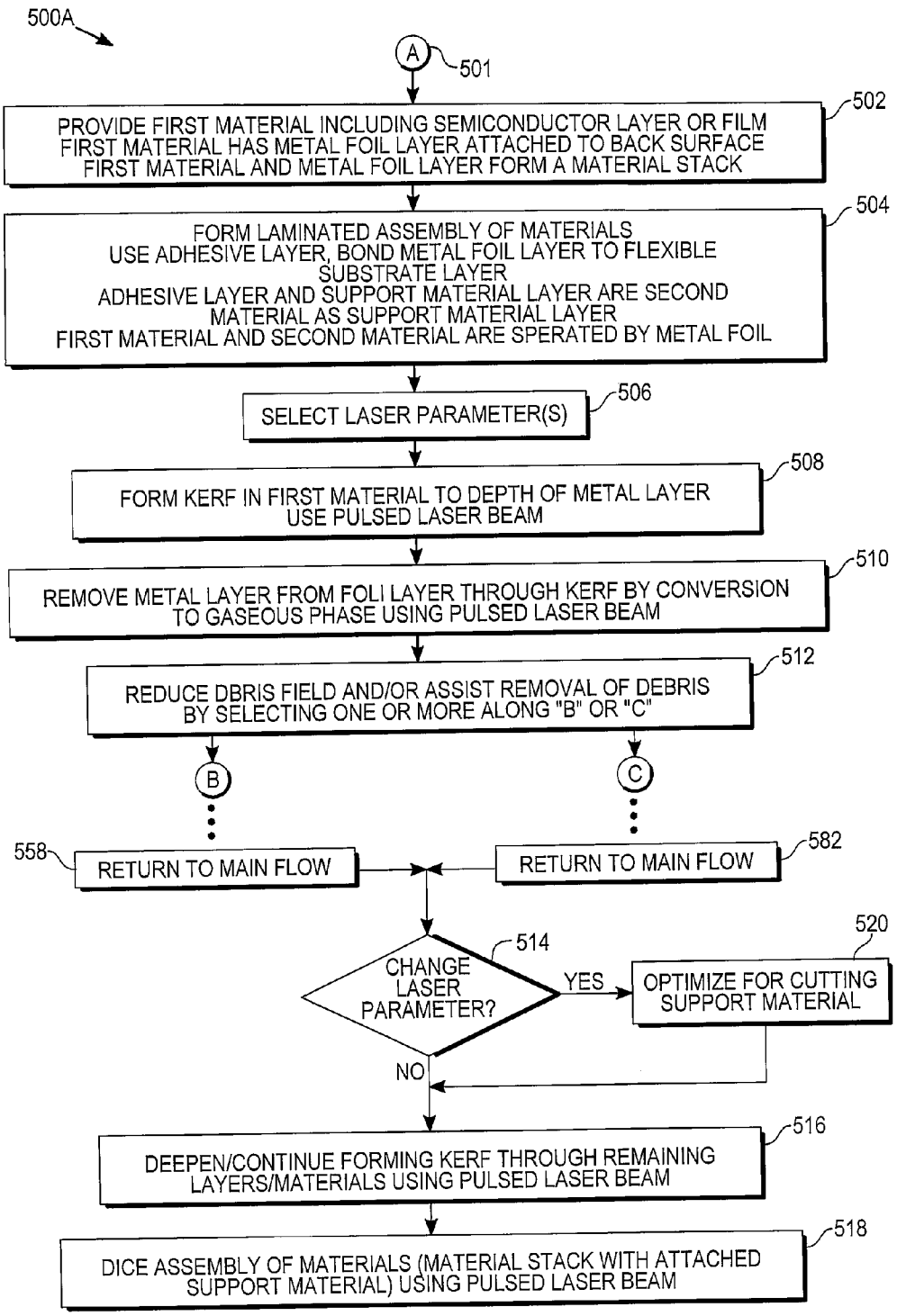
FIGS. 5A, 5B and 5C are a flow diagram of a method of performing the laser cut of FIG. 1. The method may include using one or more of the debris removal apparatuses of FIGS. 2-4.
Figure 5B:
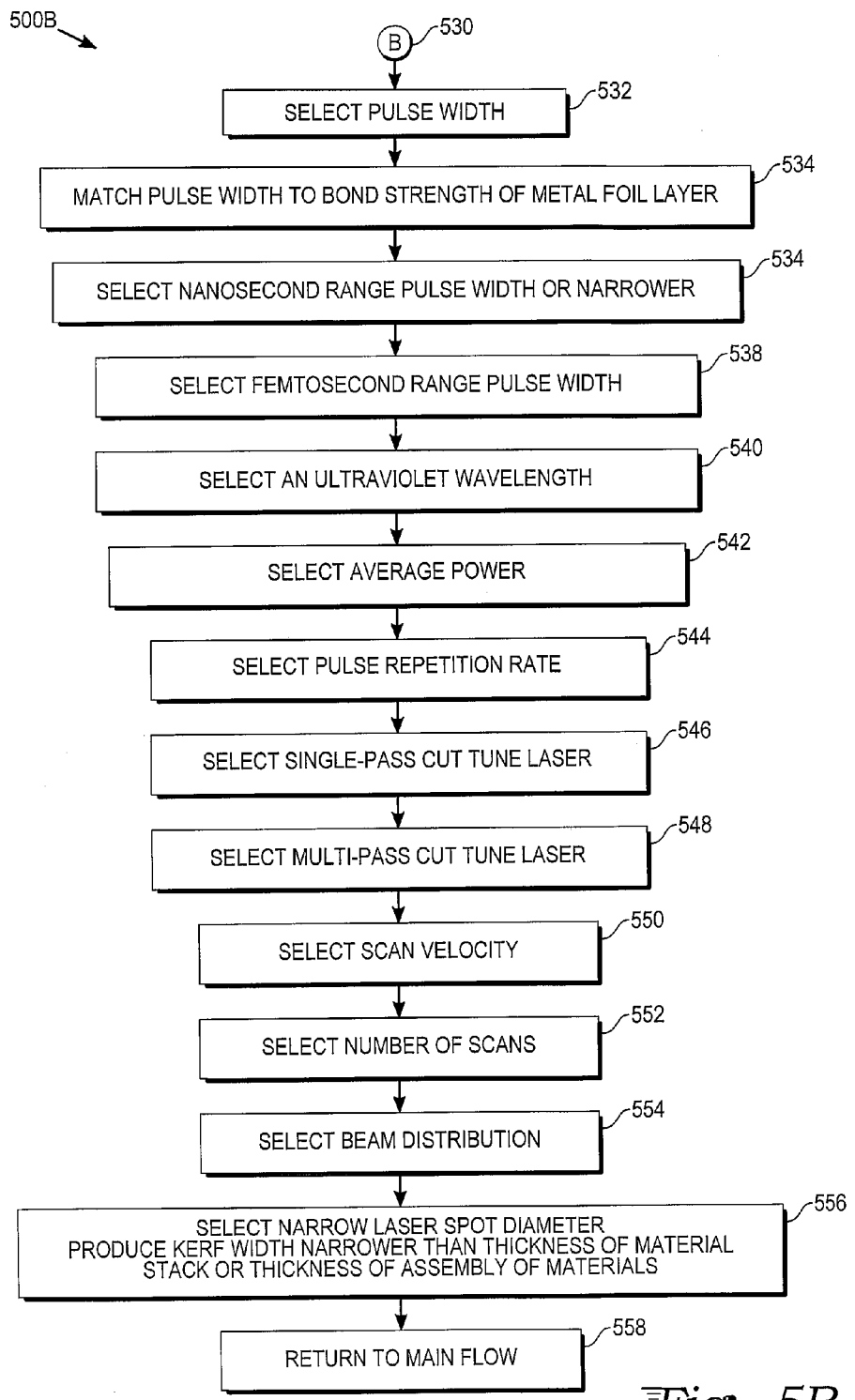
Figure 5C:
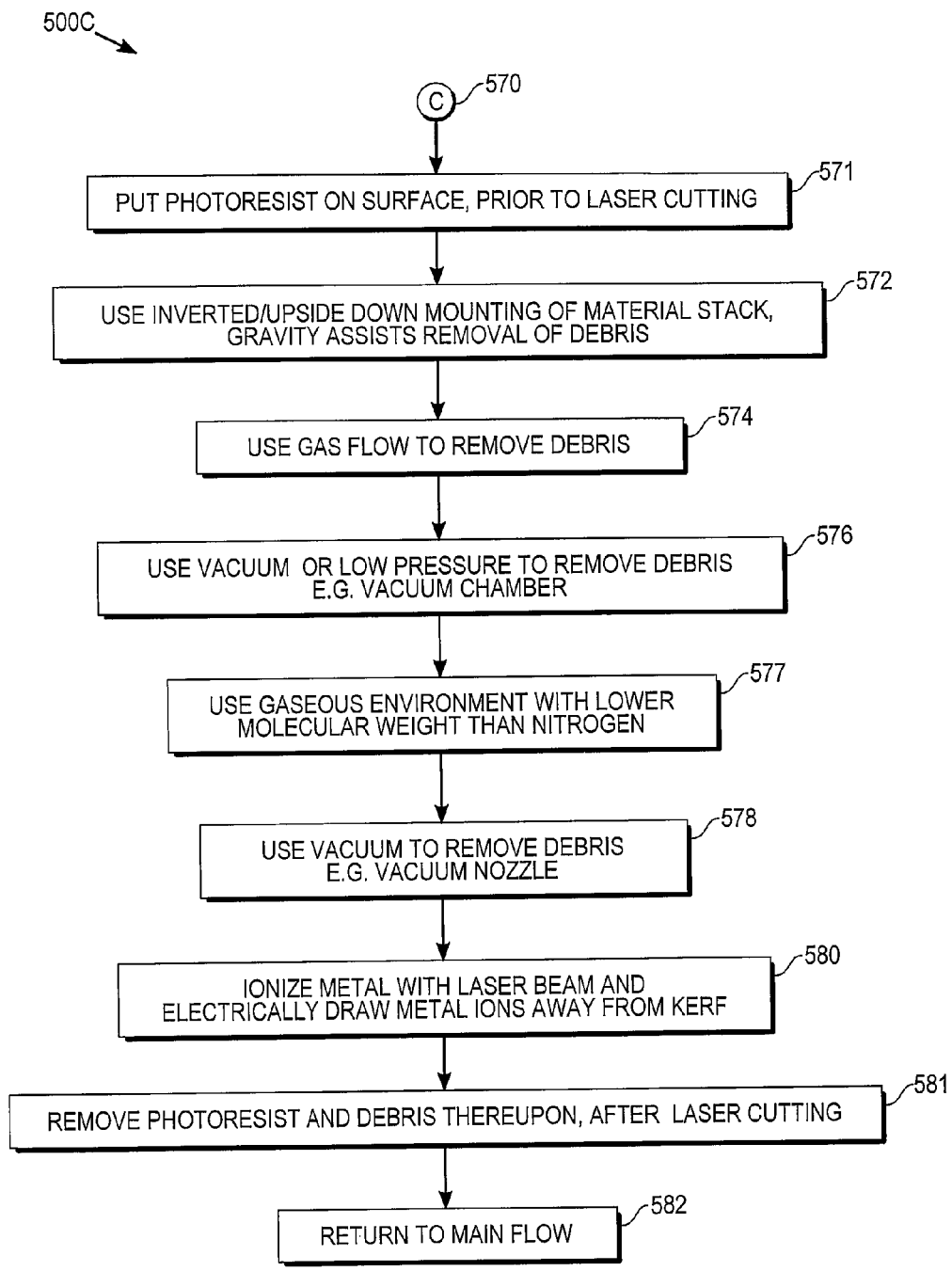

With reference to FIGS. 5A, 5B, and 5C a method 500A, 500B and 500C of performing a laser cut is shown. The method provides a method of cutting through dissimilar materials separated by a metal foil, a method of laser dicing dissimilar materials separated by metal foil, and methods for assisting removal of gasified or particulate debris and reducing a debris field, all of which relate to laser cutting. Further embodiments of the method use some of the steps, combine some of the steps or change the sequences of some of the steps.

With reference to FIG. 5A, the method 500A for performing a laser cut starts at entry point "A" 501 and has blocks as shown. In a block 502, a first material including a semiconductor layer or film is provided. The first material has a front surface and a back surface. The first material has a metal foil attached to the back surface of the first material. The first material and the metal foil form a material stack. In a block 504, a laminated assembly of materials is formed. A flexible substrate layer is bonded to the metal foil layer, using an adhesive layer. The adhesive layer and the flexible substrate layer are a second material that is a support material layer, dissimilar to the first material. The first material and the second material are separated by the metal foil. In a block 506, at least one laser parameter is selected. In a block 508, a kerf is formed in the first material to a depth of the metal foil layer, using a pulsed laser beam. In a block 510, metal is removed from the foil layer through the kerf, by conversion to a gas phase, such as an ionized plasma, using the pulsed laser beam. In a block 512, the removal of debris is assisted and/or the debris field is reduced e.g. by selecting one or more along the method following entry point "B" 530 or the method following entry point "C" 570. The debris field can be reduced by laser tuning and/or assisted removal of debris. In a block 514, the laser parameter selected in a block 506 may be changed. If the answer to the question of changing the laser parameter is "no", the method proceeds to block 516 directly. If the answer to the question of changing the laser parameter is "yes", in a block 520 the laser parameter is changed and optimized for cutting the support material, and the method proceeds to block 516. In a block 516, the kerf is deepened or continued by cutting through the remaining layers or materials. In a block 518, the assembly of materials is diced using the pulsed laser beam. The assembly of materials being diced is the material stack with the attached support material, i.e. the first material and the second material separated by the metal foil layer.

With reference to FIG. 5B, the method 500B for reducing the debris field starts at entry point "B" 530 and has blocks as shown. One or more of the blocks may be selected for reducing the debris field. In a block 532, a pulse width of the pulsed laser is selected. In a block 534, the pulse width is matched to the bond strength of the metal in the metal foil layer. In a block 536, a pulse width is selected in the nanosecond range or narrower. In a block 538, a pulse width is selected in the femtosecond range. In a block 540, an ultraviolet wavelength is selected. In a block 542, the average power is selected. In a block 544, the pulse repetition rate is selected. In a block 546, a single pass cut is selected, and the laser is tuned accordingly. In a block 548, a multi-pass cut is selected, and the laser is tuned accordingly. In a block 550, a scan velocity is selected. In a block 552, the number of scans is selected. For example, in a single-pass cut the number of scans is equal to one. In a multi-pass cut the number of scans is greater than one. In a block 554, a beam distribution is selected. For example the beam distribution or cross-section may be a Gaussian distribution. The beam distribution may be a "top hat" distribution i.e. essentially uniform and with a sharp drop-off in intensity at the edges of the beam. In a block 556, a narrow laser spot diameter is selected. The narrow laser spot may produce a kerf width narrower in one embodiment than the thickness of the material stack i.e. the first material and the metal foil layer or narrower in a further embodiment than the thickness of the assembly of materials i.e. the first material and second material separated by the metal foil layer. In a block 558 at the end of the method 500B, there is a return to the main flow.

With reference to FIG. 5C, the method 500C for assisting the removal of debris produced by laser cutting starts at entry point "C" 570 and has blocks as shown. One or more of the blocks may be selected for assisting removal of the debris. In a block 571, photoresist is put on the surface of the stack of materials. The photoresist collects debris and protects the surface of the materials beneath the photoresist from the debris. In a block 572, an inverted or upside down mounting of the stack of materials is used. Gravity assists the removal of debris. In a block 574, a gas flow is used to remove debris. In a block 576, a vacuum or low pressure such as applied using a vacuum chamber is used to remove the debris. In a block 577, a gaseous environment with a lower molecular weight and nitrogen is used during the laser cutting. The low molecular weight gaseous environment increases the rate of removal of material by conversion to a gaseous state in the laser cut. In a block 578, a vacuum such as applied using a vacuum nozzle is used to remove the debris. In a block 580, the metal is ionized with the laser beam. Metal ions are electrically drawn away from the kerf. Imposition of an electric field can draw the metal ions away. In a block 581, the photoresist is removed after the laser cutting. Debris that adheres to or settles on the photoresist during the laser cutting is removed along with the photoresist. In a block 582 at the end of the method 500C, there is a return to the main flow.

What is a claimed is:

1. A method of laser cutting through dissimilar materials separated by a metal foil comprising:
    providing a material stack that includes at least one semiconductor layer having a front surface, a back surface, and a metal foil layer attached to the back surface of the at least one semiconductor layer;
    attaching the metal foil layer to an insulative support material layer;
    selecting a laser parameter for a pulsed laser beam to create a kerf in the material stack to a depth of the metal foil layer and to remove metal from the metal foil layer through the kerf primarily by conversion of the metal to a gaseous phase rather than by melting, thereby reducing a production of metal slag and deposition thereof upon the semiconductor layer;
    assisting removal of gasified or particulate debris produced by the pulsed laser beam cutting through the material stack;
    changing the laser parameter for the pulsed laser beam to optimize for cutting the support material layer; and
    dicing the material stack and the attached support material layer, using the pulsed laser beam with the selected laser parameter and the changed laser parameter.

2. The method of claim 1 wherein the laser parameter is a wavelength of the laser beam.

3. The method of claim 1 wherein selecting the laser parameter includes selecting a pulse width and further comprising matching the pulse width of the laser beam to a bond strength of the metal foil layer.

4. The method of claim 1 wherein selecting the laser parameter includes selecting a pulse width in a range of nanoseconds or narrower.

5. The method of claim 1 wherein selecting the laser parameter includes selecting an ultraviolet wavelength for creating the kerf.

6. The method of claim 1 wherein selecting the laser parameter includes selecting an average power of the pulsed laser beam.

7. The method of claim 1 wherein selecting the laser parameter includes selecting a pulse repetition rate.

8. The method of claim 1 wherein selecting the laser parameter includes selecting a single-pass cut and further comprising selecting a scan velocity such that the pulsed laser beam only just cuts through a back surface of the support material layer in the single-pass cut.

9. The method of claim 1 wherein selecting the laser parameter includes selecting a beam distribution and further comprising selecting a spot diameter so as to produce a width of the kerf that is narrower than a thickness of the material stack.

10. The method of claim 1 wherein assisting the removal of debris includes using an upside down mounting of the material stack so that gravity assists the removal of the debris.

11. The method of claim 1 wherein assisting the removal of debris includes using a gas flow or a vacuum directed to remove the debris.

12. The method of claim 1 wherein assisting the removal of debris includes applying a photoresist to the material stack prior to laser cutting and removing the photoresist and the debris thereupon after the laser cutting.

13. A method of laser dicing dissimilar materials separated by a metal foil comprising:
providing a semiconductor film that has semiconductor devices thereupon and has a front surface, a back surface and a metal layer attached to the back surface of the film;
laminating the film to a flexible substrate, using an adhesive layer to bond the flexible substrate to the metal layer backing the film;
forming a kerf by using a laser beam to remove respective material from the semiconductor film, the metal layer, the adhesive layer and the flexible substrate, with the respective material being removed from the metal layer primarily by conversion of metal to a gaseous phase, thereby reducing deposition of metal slag upon the semiconductor film in a debris field;
reducing the debris field during laser cutting of the metal layer; and
dicing the film, the metal layer, the adhesive layer and the flexible substrate by deepening the kerf.

14. The method of claim 13 wherein reducing the debris field includes using a pulse width of the laser beam in a femtosecond range and matched to a bond strength of the respective material of the metal layer.

15. The method of claim 13 wherein reducing the debris field includes using an inverted mounting of the semiconductor film, the metal layer, the adhesive layer and the flexible substrate such that the semiconductor film faces in a downward direction and debris falls in the downward direction, and further comprising aiming the laser beam in an upward direction towards the front surface of the semiconductor film.

16. The method of claim 13 wherein reducing the debris field includes using a gas flow directed towards the front surface of the film to flush out and carry away debris.

17. The method of claim 13 wherein reducing the debris field includes applying a vacuum or low pressure in a vacuum chamber containing the semiconductor film laminated to the flexible substrate.

18. The method of claim 13 wherein reducing the debris field includes using a narrow spot diameter from a specified laser so as to reduce a width of the kerf.

19. The method of claim 13 wherein reducing the debris field includes ionizing the metal with the laser beam and electrically drawing metal ions away from the kerf.

20. The method of claim 13 wherein reducing the debris field includes using a gaseous environment with a lower molecular weight than nitrogen.

\* \* \* \* \*